(12) United States Patent
Choi

(10) Patent No.: US 7,768,849 B2
(45) Date of Patent: Aug. 3, 2010

(54) SEMICONDUCTOR MEMORY DEVICE CAPABLE OF OPTIMIZING SIGNAL TRANSMISSION POWER AND POWER INITIALIZING METHOD THEREOF

(75) Inventor: Young-Don Choi, Seoul (KR)

(73) Assignee: Samsung Electronics Co., Ltd., Yeongtong-gu, Suwon-si, Gyeonggi-do (KR)

(*) Notice: Subject to any disclaimer, the term of this patent is extended or adjusted under 35 U.S.C. 154(b) by 278 days.

(21) Appl. No.: 12/106,175

(22) Filed: Apr. 18, 2008

(65) Prior Publication Data

US 2008/0259669 A1    Oct. 23, 2008

(30) Foreign Application Priority Data

Apr. 18, 2007    (KR) .................. 10-2007-0037967

(51) Int. Cl.
*G11C 29/00* (2006.01)
(52) U.S. Cl. ....................... 365/201; 365/227
(58) Field of Classification Search ................ 365/201, 365/227, 228; 327/143; 323/901
See application file for complete search history.

(56) References Cited

U.S. PATENT DOCUMENTS 5,990,730 A * 11/1999 Shinozaki ................. 327/544

2002/0036338 A1 * 3/2002 Matsuo et al. ............. 257/686

FOREIGN PATENT DOCUMENTS

| KR | 2000-0041045 | 7/2000 |
| KR | 2006-0080424 | 7/2006 |
| KR | 2007-0013036 | 1/2007 |

OTHER PUBLICATIONS

English language abstract of Korean Publication No. 2000-0041045.
English language abstract of Korean Publication No. 2006-0080424.
English language abstract of Korean Publication No. 2007-0013036.

* cited by examiner

*Primary Examiner*—Vu A Le
(74) *Attorney, Agent, or Firm*—Muir Patent Consulting, PLLC

(57) ABSTRACT

A semiconductor memory device can automatically control signal transmission power on-chip based on a wireless signal transmission. The semiconductor memory device can have a multi-chip stack structure. A power initializing method of the semiconductor memory device can comprise providing a test signal generated by a signal-providing chip to a first chip, checking whether the test signal provided to the first chip has an error, providing the checking result to the signal-providing chip, setting the power of a first signal provided to the first chip according to the checking result, and setting the power of a signal provided to a second chip adjacent to the first chip and close to the signal-providing chip using the power of the first signal.

23 Claims, 9 Drawing Sheets

SEMICONDUCTOR MEMORY DEVICE CAPABLE OF OPTIMIZING SIGNAL TRANSMISSION POWER AND POWER INITIALIZING METHOD THEREOF

CROSS-REFERENCE TO RELATED PATENT APPLICATION

This application claims priority to Korean Patent Application No. 10-2007-0037967, filed on Apr. 18, 2007, the disclosure of which is incorporated herein in its entirety by reference.

BACKGROUND

1. Technical Field

The disclosed technology relates to a semiconductor memory device and a power initializing method thereof and, more particularly, to a semiconductor memory device based on wireless signal transmission between chips, which is capable of optimizing signal transmission power, and a power initializing method thereof.

2. Description of the Related Art

The capacity and operating speed of a semiconductor memory device used as a memory in most electronic systems are increasing due to continued development in the semiconductor industry and in response to user requests. Furthermore, various attempts to mount a memory with larger capacity in a smaller area and drive the memory at a higher speed are being made. To mount a large-capacity memory in a small area, a plurality of semiconductor chips can be stacked in a single semiconductor package. FIG. 1 illustrates various structures for providing signals to a plurality of semiconductor chips included in a semiconductor package.

Referring to FIG. 1, the semiconductor package includes a substrate 1 and multiple semiconductor chips 2A and 2B. The semiconductor chips are stacked on one side of the substrate 1, and the substrate 1 provides a signal supplied from an external controller (not shown) to the semiconductor chips. The semiconductor chip 2A can be a chip including a logic circuit for operating a memory chip and the semiconductor chip 2B can be a memory chip including a memory cell array that receives a signal provided by the semiconductor chip 2A and operates according to the received signal.

FIG. 1A illustrates a structure in which a signal is provided to the semiconductor chips 2A and 2B through wire bonding, and FIG. 1B illustrates a structure in which a signal is provided to the semiconductor chips 2A and 2B through a via. Although the wire bonding structure illustrated in FIG. 1A is a low manufacturing cost arrangement, the number of wires connected to the semiconductor chips 2A and 2B is limited and signal transmission paths are long. The signal transmission structure using a via as illustrated in FIG. 1B is advantageous in terms of the number of vias and a signal transmission path. However, the signal transmission structure using a via is a high manufacturing cost arrangement and causes the deterioration of yield in order to secure a known good die (KGD).

FIG. 1C illustrates a structure that includes wireless signal transmission between the semiconductor chips 2A and 2B. When the semiconductor chip 2A including a logic circuit provides a signal to the semiconductor chips 2B including memory cells, the signal can be transmitted according to a capacitive coupling or inductive coupling method, in which case a signal can be transmitted to at least three semiconductor chips. This wireless signal transmission between semiconductor chips does not require an additional process for connecting a wire or forming a via. In addition, the wireless signal transmission between semiconductor chips allows for easy addition or subtraction of chips to increase yield in terms of KGD and to improve the density of channels for signal transmission.

In the case of a semiconductor memory package including a plurality of semiconductor chips in a stack structure, if signals having the same power are provided to signal-receiving semiconductor chips even though the semiconductor chips have different signal communication distances, an error may be generated in the signals provided to the signal-receiving semiconductor chips. When a signal is wirelessly transmitted between semiconductor chips, as illustrated in the structure of FIG. 1C, the transmission power of the signal provided to each of the semiconductor chips must be appropriately controlled so that an error is not generated in the signal provided to the semiconductor chips.

FIG. 2A illustrates a conventional circuit for setting signal transmission power, and FIG. 2B illustrates a signal power test result according to a signal communication distance and signal transmission power. Referring to FIG. 2A, a means 10 for controlling the transmission power of a signal can include a control register 11 and four power controllers 12a, 12b, 12c and 12d. A result obtained by accessing the control register 11 is provided to each of the power controllers 12a, 12b, 12c and 12d, and a current $I_t$ having a magnitude according to the width W of a predetermined transistor included in each of the power controllers 12a, 12b, 12c and 12d is generated. The current $I_t$ is controlled according to the access result, the power of the signal is controlled according to the current $I_t$, and the signal with the controlled power is provided to a semiconductor chip.

Referring to FIG. 2B, when a signal is provided to a semiconductor chip having a short communication distance, the signal transmission is checked as "pass" even though the signal is provided to the semiconductor chip with low transmission power. However, the signal should be provided to a semiconductor chip having a long communication distance with high transmission power. The power of the signal when the test result corresponds to "pass" is measured to set the control register 11.

However, this signal transmission power setting method requires a long time to set the control register. Furthermore, when signal transmission fails due to a variation in the surrounding environment after the control register is set, the transmission power needs to be reset.

SUMMARY

The disclosed technology provides a wireless signal transmission based semiconductor memory device capable of optimizing signal transmission power and a power initializing method thereof.

Certain embodiments provide a power initializing method of a semiconductor memory device having multiple chips in a stack structure, wherein the power initializing method includes providing a test signal generated by a signal-providing chip to a first chip, checking whether the test signal provided to the first chip has an error, providing the checking result to the signal-providing chip, setting the power of a first signal provided to the first chip according to the checking result, and setting the power of a signal provided to a second chip adjacent to the first chip and close to the signal-providing chip using the power of the first signal.

The first chip may be the chip farthest from the signal-providing chip.

An initial power value of the test signal provided to the first chip may be set to a first power value that has a large enough power to be checked as "pass."

The setting of the power of the first signal may include controlling the test signal such that the test signal has a second power value that is smaller than the first power value when the checking result corresponds to "pass," and providing the test signal having the second power value to the first chip.

The setting of the power of the first signal may include checking whether the test signal having the second power value, provided to the first chip, has an error, and providing the checking result to the signal-providing chip.

The setting of the power of the first signal may include setting the power of the first signal to the first power value when the checking result for the second power value corresponds to "fail."

The setting of the power of the first signal may include decreasing the power of the test signal in stages until the checking result becomes "fail" and providing the test signal to the first chip when the checking result corresponds to "pass."

The setting of the power of the first signal may include setting the power of the first signal to an $(n-1)^{th}$-power value corresponding to the smallest power value among power values checked as "pass" if the test signal is checked as "fail" when the test signal has an $n^{th}$ power value (e.g., where n is an integer equal to or greater than 3).

The setting of the power of the second signal may include providing a test signal having power corresponding to the set power of the first signal to the second chip, checking whether the test signal provided to the second chip has an error, providing the checking result to the signal-providing chip, and setting the smallest value among test signal power values checked as "pass" as the power of the second signal provided to the second chip according to the checking result.

The semiconductor memory device may include first through $n^{th}$ chips receiving signals from the signal-providing chip, and signal power may be sequentially set for the first chip farthest from the signal-providing chip through the $n^{th}$ chip closest to the signal-providing chip.

The power of a signal, previously set, may be used as an initial power value of the test signal when the power of the next signal is set.

The multiple chips may wirelessly transmit and receive signals according to inductive coupling.

The test signal may be a pseudo random binary sequence (PRBS) signal.

Certain embodiments provide a power initializing method of a semiconductor memory device including multiple semiconductor chips transmitting and receiving signals according to inductive coupling, where the power initializing method includes wirelessly providing a test signal having a first power value (generated by a signal-providing chip) to a first chip, checking whether the test signal provided to the first chip has an error, wirelessly providing the checking result to the signal-providing chip, and setting the power of a first signal provided to the first chip according to the checking result.

Certain embodiments provide a semiconductor memory device having multiple chips in a stack structure, including a signal-providing chip generating a test signal having a predetermined pattern and controlling the power of the test signal, and at least one signal-receiving chip receiving the test signal, checking whether the test signal has an error and outputting the checking result, wherein the power of a first signal provided to a first signal-receiving chip is set according to the checking result and the power of a second signal provided to a second signal-receiving chip adjacent to the first signal-receiving chip and close to the signal-providing chip is set using the set power of the first signal in a power initializing operation.

The signal-providing chip may include a first signal generator generating the test signal and a first power controller controlling the power of the test signal generated by the first signal generator.

The signal-receiving chip may include a second signal generator generating a signal having the same pattern as the test signal generated by the first signal generator and an error checker comparing the signal generated by the second signal generator to the test signal provided by the signal-providing chip to check whether the test signal has an error.

BRIEF DESCRIPTION OF THE DRAWINGS

The foregoing and other objects, features, and advantages of the present invention will become more readily apparent from the following detailed description of various embodiments that proceed with reference to the following drawings.

DETAILED DESCRIPTION

Figure 1A:
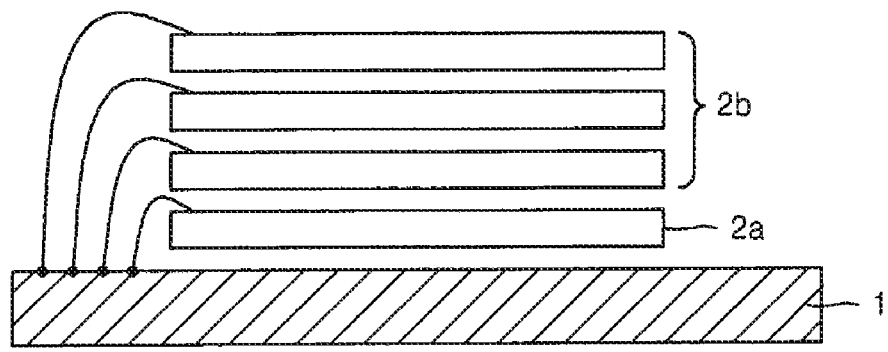
FIG. 1 illustrates signal transmission methods in a semiconductor package having multiple semiconductor chips.
Figure 1B:
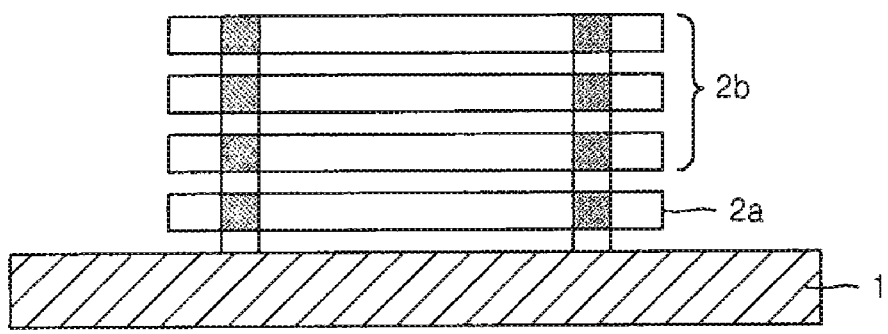
Figure 1C:
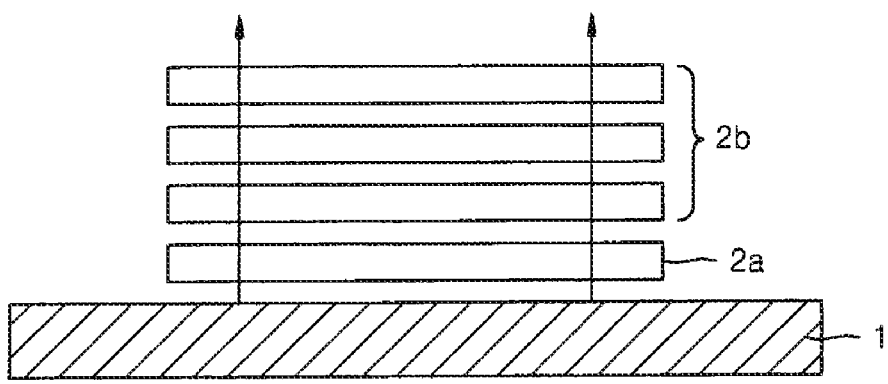
Figure 2A:
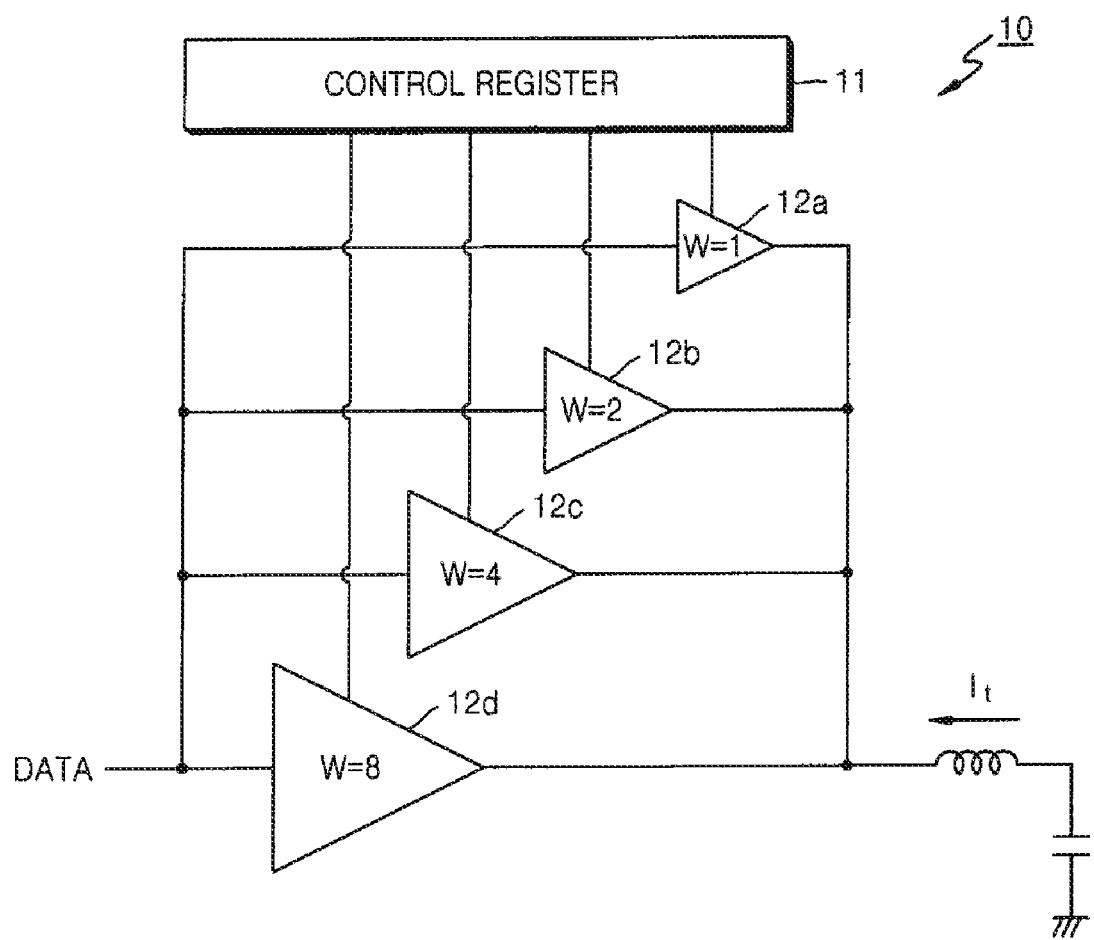
FIG. 2A illustrates a conventional circuit for setting signal transmission power.
Figure 2B:
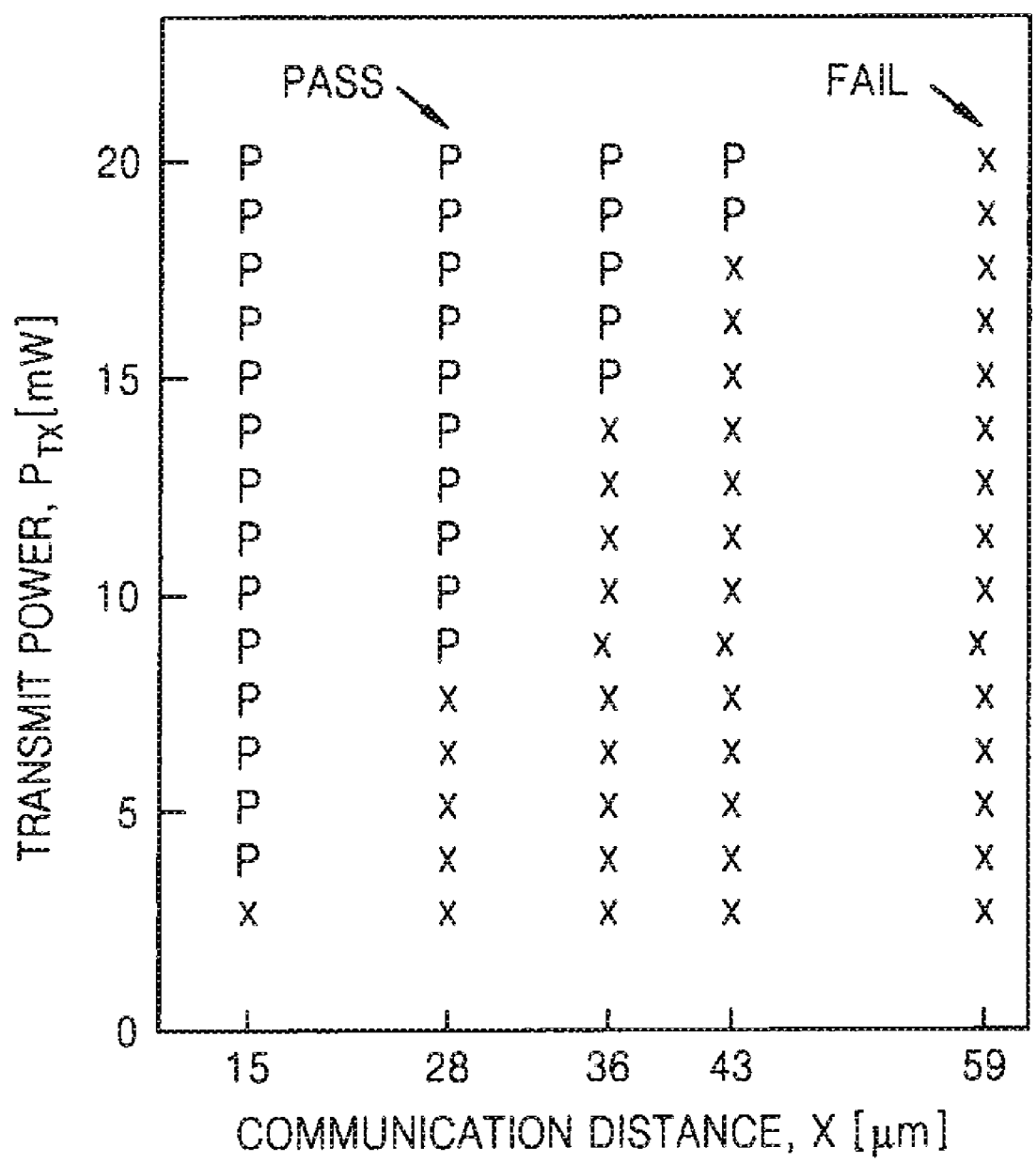
FIG. 2B illustrates a signal transmission test result according to a signal communication distance and transmission power.

The disclosed technology will now be described more fully with reference to the accompanying drawings, in which exemplary embodiments of the invention are shown. The disclosed technology may, however, be embodied in many different forms and should not be construed as being limited to the embodiments set forth herein; rather, these embodiments are provided so that this disclosure will be thorough and complete, and will fully convey the technical concepts to those skilled in the art. Throughout the drawings, like reference numerals refer to like elements.

Figure 3:
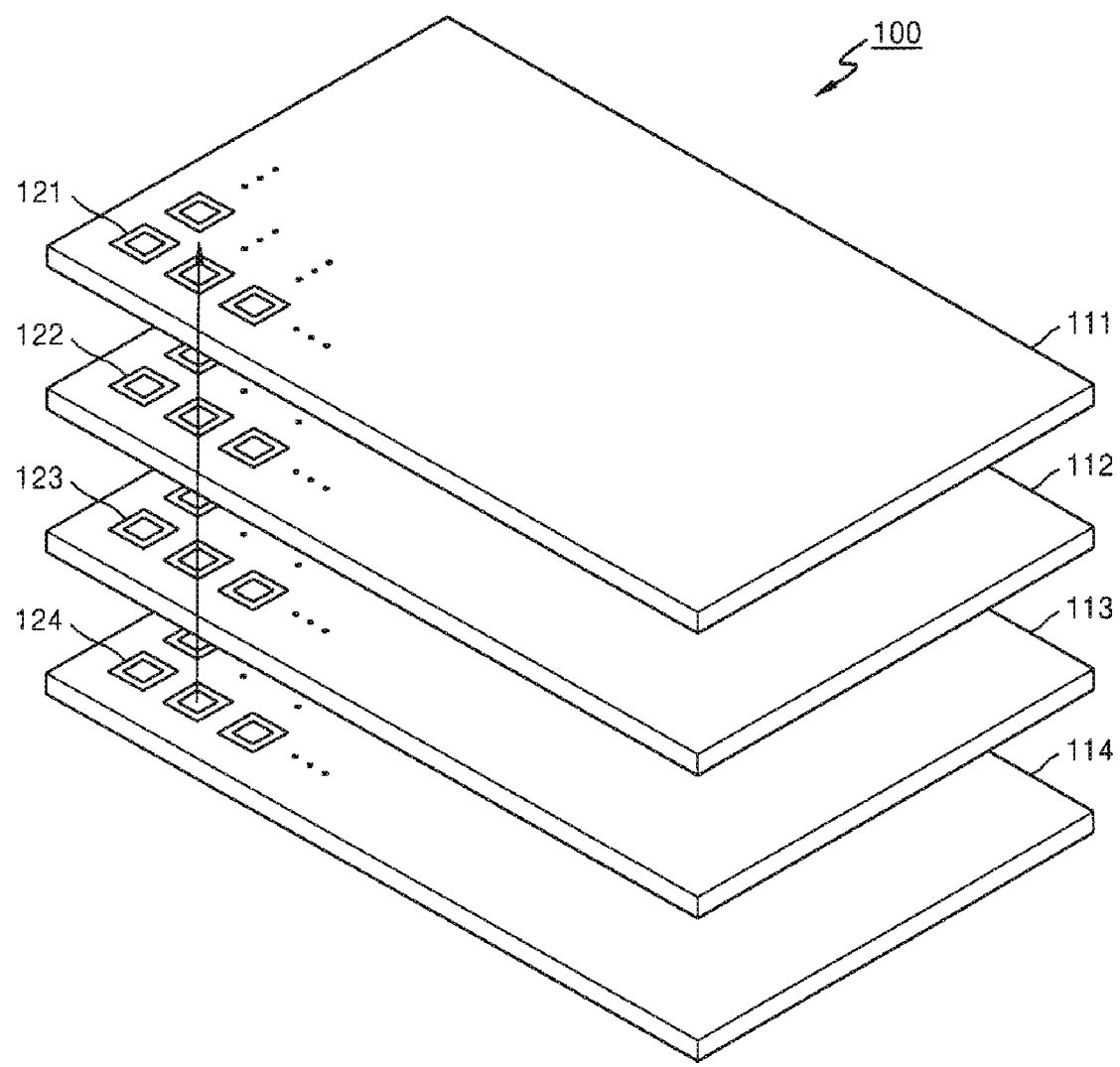
FIG. 3 illustrates multiple chips transmitting and receiving a signal based on inductive coupling.

FIG. 3 illustrates an exemplary semiconductor memory device 100 having multiple chips that transmit and receive signals based on inductive coupling. The semiconductor memory device 100 illustrated in FIG. 3 includes multiple semiconductor chips 111, 112, 113 and 114 in a stack structure. For example, the first, second and third semiconductor chips 111, 112 and 113 can be memory chips each including a memory cell array and the fourth semiconductor chip 114 can include a logic circuit for operating the memory chips 111, 112 and 113 located thereon and provide signals to the first, second and third memory chips 111, 112 and 113.

The semiconductor chips 111, 112, 113 and 114 respectively include multiple channels 121, 122, 123 and 124 having inductors in order to transmit and receive signals according to inductive coupling. Signals generated by the fourth semiconductor chip 114 are wirelessly provided to the first, second and third semiconductor chips 111, 112 and 113 through the plurality of channels 121, 122, 123 and 124.

The first semiconductor chip 111 is farthest from the fourth semiconductor chip 114 corresponding to a signal-providing chip and the third semiconductor chip 113 is closest to the fourth semiconductor chip 114. While FIG. 3 illustrates that the three semiconductor chips 111, 112 and 113 receive signals from the fourth semiconductor chip 114, the number of semiconductor chips receiving signals from the fourth semiconductor 114 is not limited to three.

When a signal is wirelessly transmitted and received according to inductive coupling, a coupling coefficient is inversely proportional to a signal transmission distance, and thus a signal provided to the first semiconductor chip 111 farthest from the signal-providing semiconductor chip 114 requires large transmission power. When the signal is provided to the third semiconductor chip 113 closest to the signal-providing chip 114, the signal needs transmission power smaller than the transmission power required for the signal provided to the first semiconductor chip 111.

Figure 4:
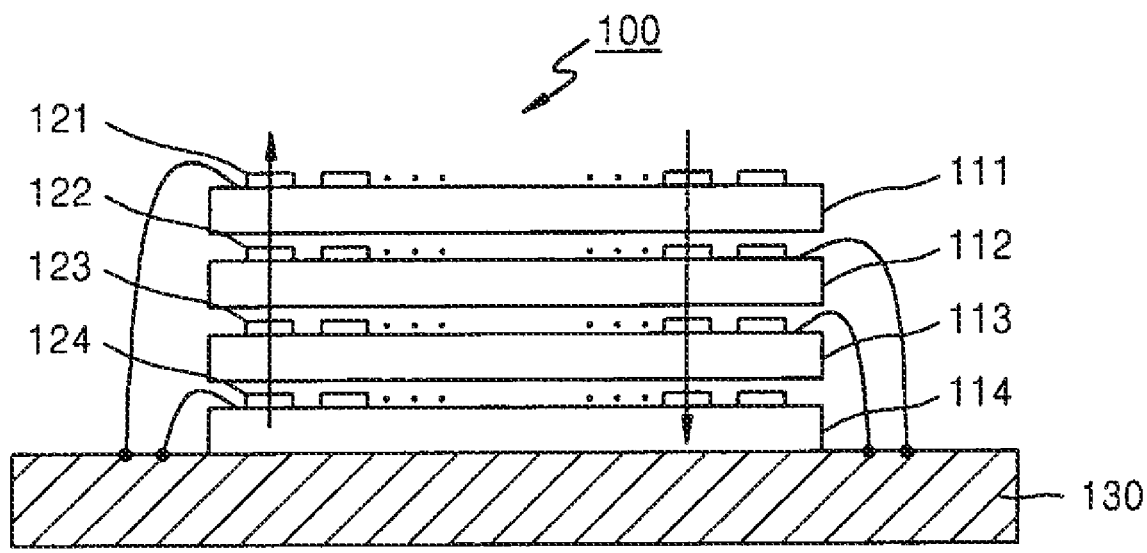
FIG. 4 is a cross-sectional view of a semiconductor memory device for illustrating a connecting state of the multiple chips illustrated in FIG. 3 and signal transmission paths in the semiconductor memory device.

FIG. 4 is a cross-sectional view of the semiconductor memory device 100 illustrated in FIG. 3 for illustrating a connecting state of the multiple chips included in the semiconductor memory device 100 and signal transmission paths. Referring to FIG. 4, the first, second, third and fourth semiconductor chips 111, 112, 113 and 114 can be connected to a semiconductor substrate 130 (e.g., through wire bonding or other means). When the fourth semiconductor chip 114 is a signal-providing chip including a logic circuit, the first, second and third semiconductor chips 111, 112 and 113 located on the fourth semiconductor chip 114 can be wirelessly provided with at least one signal from the fourth semiconductor chip 114 according to inductive coupling. When the first and fourth semiconductor chips 111 and 114 are signal-providing chips, signal transmission between semiconductor chips can be performed bi-directionally. For example, the first, second and third semiconductor chips 111, 112 and 113 wirelessly receive at least one signal from the fourth semiconductor chip 114 according to inductive coupling and the second, third and fourth semiconductor chips 112, 113 and 114 wirelessly receive at least one signal from the first semiconductor chip 111 according to inductive coupling. An exemplary power initializing operation of the semiconductor memory device 100 is explained in detail with reference to FIG. 5.

Figure 5:
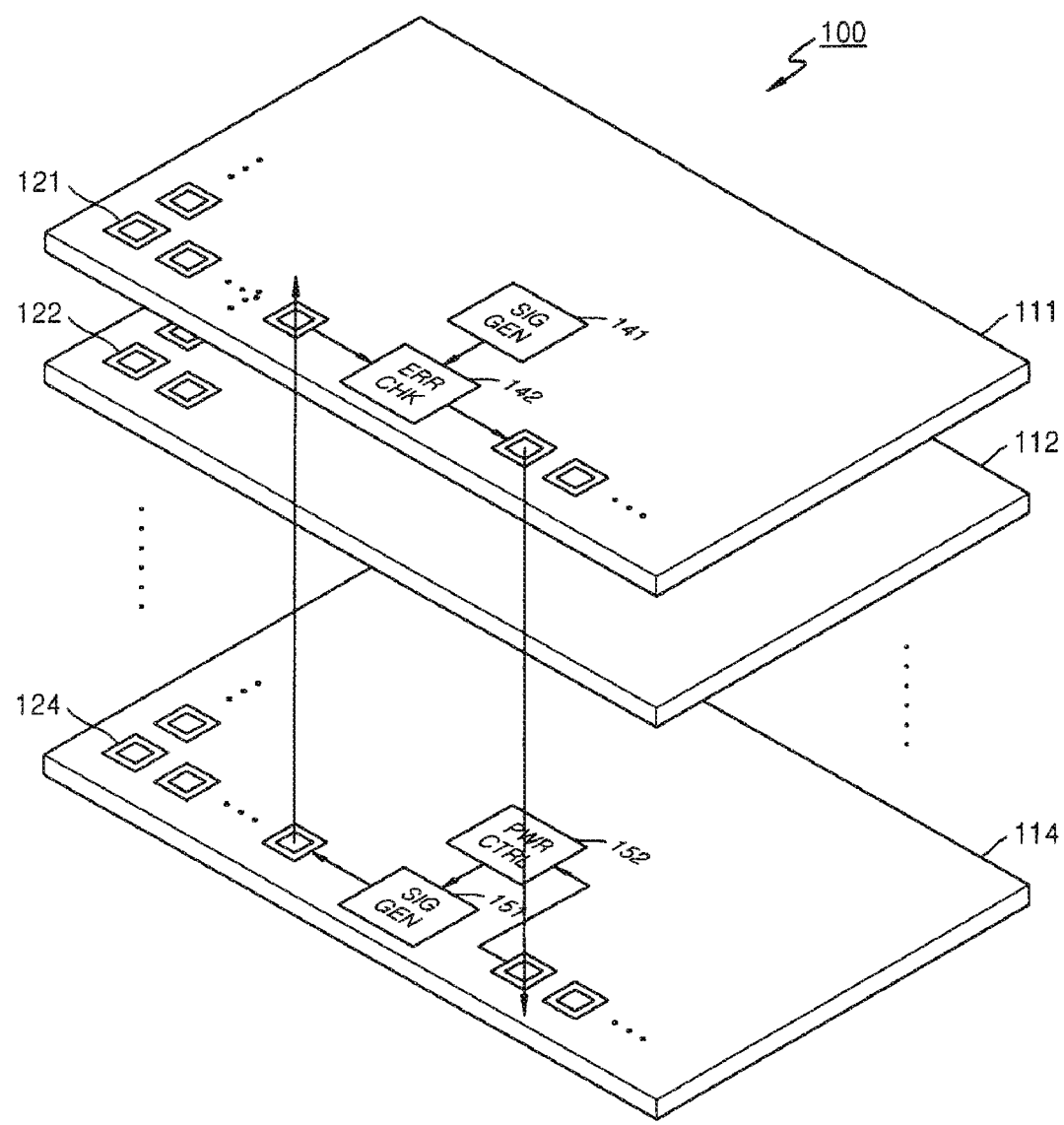
FIG. 5 illustrates a power initializing operation of the semiconductor memory device illustrated in FIG. 3 according to a certain embodiment of the disclosed technology.

FIG. 5 illustrates an exemplary power initializing operation of the semiconductor memory device 100 illustrated in FIG. 3 according to certain embodiments of the disclosed technology. As described above, the fourth semiconductor chip 114 is a signal-providing chip, and the first, second and third semiconductor chips 111, 112 and 113 receive at least one signal from the fourth semiconductor chip 114.

Although FIG. 5 illustrates that the first semiconductor chip 111 includes predetermined circuit blocks, the second and third semiconductor chips 112 and 113 can also include the same circuit blocks. Furthermore, the semiconductor memory device 100 can include signal-receiving chips in addition to the first, second and third semiconductor chips 111, 112 and 113.

Referring to FIG. 5, the fourth semiconductor chip 114 has a signal generator 151 for generating a test signal having a predetermined pattern. The test signal is provided to the first semiconductor chip 111 farthest from the fourth semiconductor chip 114 through channels 124. Since the first, second, third and fourth semiconductor chips 111, 112, 113 and 114 respectively include the channels 121, 122, 123 and 124 having inductors, the test signal generated by the fourth semiconductor chip 114 is wirelessly transmitted to the first semiconductor chip 111.

The signal generator 151 can be virtually any device that generates a signal having a predetermined pattern. For example, a random number generator generating a signal having a random pattern according to a predetermined mathematical expression can be used as the signal generator 151. Preferably, the signal generator 151 of FIG. 5 is configured in the form of a circuit generating a pseudo random binary sequence (PRBS) signal having characteristics similar to those of a white noise signal.

The first semiconductor chip 111 checks whether the test signal generated by the signal generator 151 has an error. The test signal provided to the first semiconductor chip 111 has a sufficient initial power value such that the test signal is checked as "pass" by the first semiconductor 111. A power controller 152 included in the fourth semiconductor chip 114 controls the power of the test signal generated by the signal generator 151.

When the test signal is provided to the first semiconductor chip 111, an error checker 142 included in the first semiconductor chip 111 receives the test signal and checks whether the test signal has an error. The first semiconductor chip 111 further includes a signal generator 141 that generates a signal having the same pattern as the test signal generated by the signal generator 151 included in the fourth semiconductor chip 114. For example, the signal generator 141 included in the first semiconductor chip 111 can use a random number generator or a PRBS signal generator that generates a signal having the same pattern as the test signal generated by the signal generator 151 included in the fourth semiconductor chip 114.

The error checker 142 of the first semiconductor chip 111 receives the test signal provided by the fourth semiconductor chip 114 and the signal generated by the signal generator 141, and determines whether the two signals are identical to each other (e.g., to check whether the test signal has an error). The error checking result is provided to the fourth semiconductor chip 115 through a channel (that can be different from a channel through which the test signal is received, for example) of the first semiconductor chip 111.

The fourth semiconductor chip 114 controls the power of the test signal according to the error checking result. For example, when the received error checking result corresponds to "pass," the power controller 152 of the fourth semiconductor chip 114 decreases the power of the test signal according to the error checking result. The test signal with the decreased power is provided to the first semiconductor chip 111, and the first semiconductor chip 111 checks whether the received test signal has an error. A degree to which the power of the test signal is decreased according to the error checking result can be controlled in consideration of a time required for the power initializing operation and accuracy of setting power.

The error checker 142 of the first semiconductor chip 111 checks whether the received test signal has an error and provides the error checking result to the fourth semiconductor chip 114 again. When the error checking result corresponds to "pass," the power of the test signal is further decreased according to the error checking result and the test signal with the decreased power is provided to the first semiconductor chip 111 again. The first semiconductor chip 111 checks whether the received test signal has an error and provides the error checking result to the fourth semiconductor chip 114 again.

When the aforementioned operation is repeated and the error checking result corresponds to "fail," the smallest power value is selected from power values checked as "pass" and the selected power value is set as the power of a signal for the first semiconductor chip 111. Information on the set power value can be stored in a register (not shown) included in the fourth semiconductor chip 114. When a signal is transmitted to the first semiconductor chip 111, the power of the signal is controlled using the information stored in the register.

When the power of the signal for the first semiconductor chip 111 is set, the power of a signal for the second chip 112 closer to the fourth semiconductor chip 114 than the first semiconductor chip 111 is set using the signal power set for the first semiconductor chip 111.

Specifically, the fourth semiconductor chip 114 controls the initial power value of the test signal such that the initial power value of the test signal corresponds to the power value set for the first semiconductor chip 111 and provides the test signal to the second semiconductor chip 112. An error checker included in the second semiconductor chip 112 checks whether the test signal provided by the fourth semiconductor chip 114 has an error and provides the error checking result to the fourth semiconductor chip 114. When the error checking result corresponds to "pass," the fourth semiconductor chip 114 reduces the power of the test signal and provides the test signal with the reduced power to the second semiconductor chip 112. The second semiconductor chip 112 checks the test signal and provides the checking result to the fourth semiconductor chip 114.

When the above-described operation is repeated and the error checking result corresponds to "fail," the smallest power value is selected from power values checked as "pass" and set at the power of the signal for the second semiconductor chip 112. Information on the set power value can be stored in the register included in the fourth semiconductor chip 114. The power of the signal for the second semiconductor chip 112 can be used to set the power of a signal for the third semiconductor chip 113.

The aforementioned operation is performed for signal-receiving semiconductor chips (for example, the first, second and third semiconductor chips 111, 112 and 113) included in the semiconductor memory device 100 to obtain information on power values of signals to be provided to the signal-receiving chips and store the information in a predetermined register. When the signals are transmitted to the signal-receiving semiconductor chips, signal power can be optimized using the information stored in the register. That is, the smallest power value is selected from power values checked to be "pass" and provided to the semiconductor chips, thereby advantageously preventing unnecessary power consumption. Furthermore, since a power value for a semiconductor chip is set using a power value set for a semiconductor chip adjacent to the semiconductor chip, a time required to set a power value can be desirably reduced. Moreover, the aforementioned power initializing operation is performed on-chip, and thus a signal power value can be automatically controlled (e.g., according to a variation in the surrounding environment).

Figure 6:
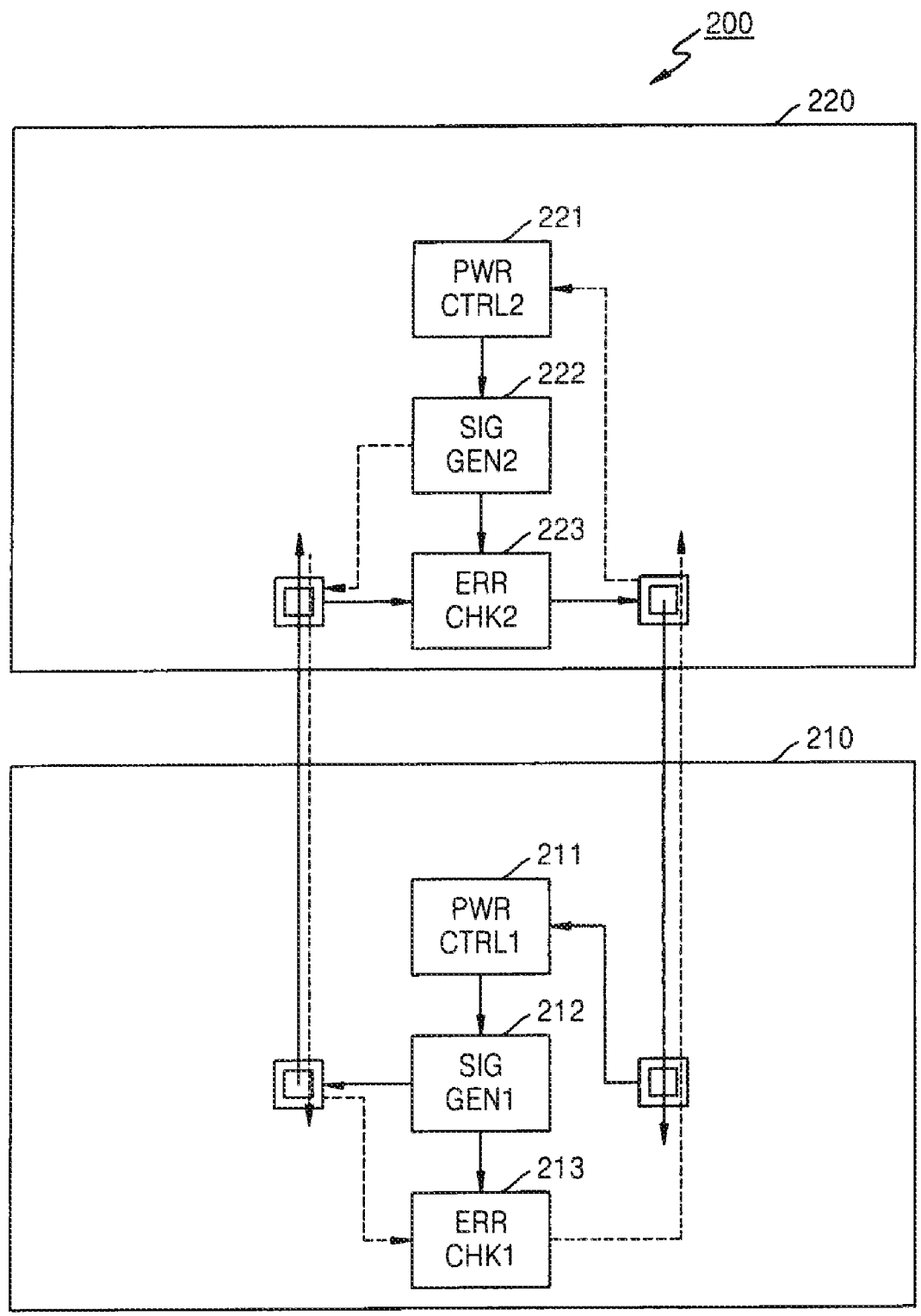
FIG. 6 illustrates a power initializing operation of a semiconductor memory device according to a certain embodiment of the disclosed technology.

FIG. 6 illustrates a power initializing operation of a semiconductor memory device 200 according to certain embodiments of the disclosed technology. Referring to FIG. 6, the semiconductor memory device 200 includes multiple semiconductor chips 210 and 220 in a stack structure. The semiconductor chips 210 and 220 can be signal-providing chips, such that at least one signal can be bidirectionally transmitted and received between the semiconductor chips 210 and 220 according to inductive coupling. A semiconductor chip (not shown) can be arranged between the semiconductor chips 210 and 220. The semiconductor chip included in the semiconductor memory device 200 can include an error checker for receiving test signals from the semiconductor chips 210 and 220 and checking whether either of the test signals has an error, as well as a signal generator.

An exemplary power initializing operation of the semiconductor memory device 200 will now be described.

The semiconductor chip 210 can include a power controller 211, a signal generator 212, and an error checker 213. The semiconductor chip 220 located above the semiconductor chip 210 can include a power controller 221, a signal generator 222, and an error checker 223. The signal generator 212 of the semiconductor chip 210 and the signal generator 222 of the semiconductor chip 220 generate signals having the same pattern and can use a random number generator or a PRBS signal generator.

A power value of a signal generated by one of the semiconductor chips 210 and 220 is set. When a power value of a signal generated by the semiconductor chip 210 is set, for example, a power initialization process as indicated by a solid line illustrated in FIG. 6 is performed.

Specifically, the test signal generated by the signal generator 212 included in the semiconductor chip 210 is provided to the semiconductor chip 220 through a predetermined channel. The signal generator 222 included in the semiconductor chip 220 generates a signal having the same pattern as the test signal generated by the signal generator 212 of the semiconductor chip 210 and provides the signal to the error checker 223. The error checker 223 receives the signal generated by the signal generator 222 and the test signal provided by the semiconductor chip 210 and checks whether the test signal has an error. The error checking result is provided to the semiconductor chip 210 through a predetermined channel, and the power controller 211 of the semiconductor chip 210 controls the power of the test signal generated by the signal generator 212 according to the error checking result. When the checking result corresponds to "pass," the power controller 211 reduces the power of the test signal.

The aforementioned operation can be repeated to select the smallest power value from power values checked to be "pass," and the selected power value is set as the power of a signal provided to the semiconductor chip 220. Signal power can be sequentially set for semiconductor chips (not shown) located between the semiconductor chip 210 and the semiconductor chip 220. A previously set power value of a semiconductor chip can be used to set a power value of a semiconductor chip adjacent to the semiconductor chip, as described above.

When the power of the signal transmitted from the semiconductor chip 210 to each of the semiconductor chips located between the semiconductor chip 210 and the semiconductor chip 220 is set, the power of a signal provided by the semiconductor chip 220 is set according to a signal transmission process as indicated by a dotted line illustrated in FIG. 6.

The power controller 221 of the semiconductor chip 220 controls a test signal generated by the signal generator 222 such that the test signal has a sufficiently large initial power value. The test signal is provided to the semiconductor chip 210 through a predetermined channel. The error checker 213 of the semiconductor chip 210 receives the signal generated by the signal generator 212 and the test signal provided by the semiconductor chip 220 and checks whether the test signal has an error. The error checking result is provided to the semiconductor chip 220, and the power controller 221 of the semiconductor chip 220 controls the power of the test signal generated by the signal generator 220 according to the error checking result.

When the power of a signal for the semiconductor chip 210 is set through the above-described operation, signal power is sequentially set for the semiconductor chips (not shown) located between the semiconductor chip 210 and the semiconductor chip 220. When the power initializing operation is finished, circuit blocks related to the power initializing operation are disabled to prevent unnecessary power consumption.

Figure 7:
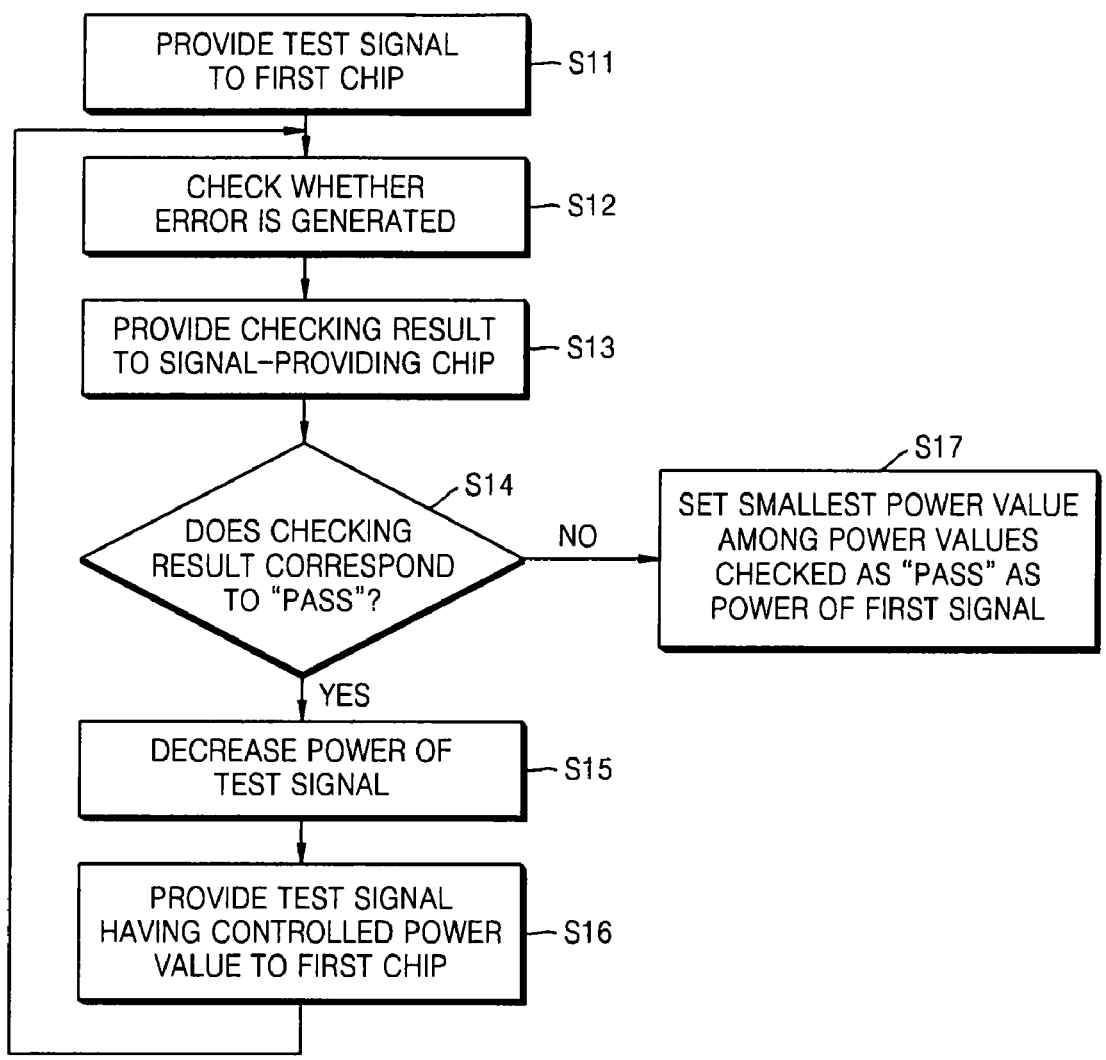
FIG. 7 is a flow chart illustrating a power initializing method of a semiconductor memory device according to a certain embodiment of the disclosed technology.

FIG. 7 is a flow chart illustrating a power initializing process of a semiconductor memory device according to certain embodiments of the disclosed technology.

In a semiconductor memory device having a multi-chip stack structure, a signal can be provided from a signal-providing chip to at least one semiconductor chip and, particularly, the signal can be wirelessly transmitted between multiple chips according to inductive coupling. It is assumed that the first through $n^{th}$ chips included in the semiconductor memory device each receive at least one signal from a signal-providing chip, where the first chip is farthest from the signal-providing chip and the $n^{th}$ chip is closest to the signal-providing chip.

The signal-providing chip generates a test signal having a predetermined pattern and provides the test signal to the first chip through a channel included in the signal-providing chip in operation S11. The first chip receives the test signal and checks whether the test signal has an error in operation S12. When the signal-providing chip generates the test signal, an initial power value of the test signal provided to the first chip is set to a value that is checked as "pass." A predetermined error checker included in the first chip checks whether the test signal has an error and provides the checking result to the signal-providing chip in operation S13.

The signal-providing chip sets the power of a signal provided to the first chip according to the checking result. Specifically, the signal-providing chip determines whether the checking result corresponds to "pass" or "fail" in operation S14, decreases the power of the test signal when the checking result corresponds to "pass" in operation S15, and provides the test signal with the decreased power to the first chip in operation S16.

The first chip receives the test signal with the decreased power value and checks whether the test signal has an error, and provides the checking result to the signal-providing chip. The signal-providing chip reduces the power of the test signal in stages until the checking result becomes "fail" and provides the test signal with the reduced power value to the first chip when the checking result corresponds to "pass."

When it is determined that the checking result corresponds to "fail" in operation S14, the smallest power value is selected from power values checked as "pass" and the selected power value is set as the power of the signal provided to the first chip in operation S17. After the power of the signal provided to the first chip farthest from the signal-providing chip is set according to the aforementioned operation, the power of a signal provided to the second chip adjacent to the first chip and close to the signal-providing chip is set. After the power of the signal provided to the second chip is set, signal power is sequentially set for remaining signal-receiving chips (such as n semiconductor chips, for example).

Figure 8:
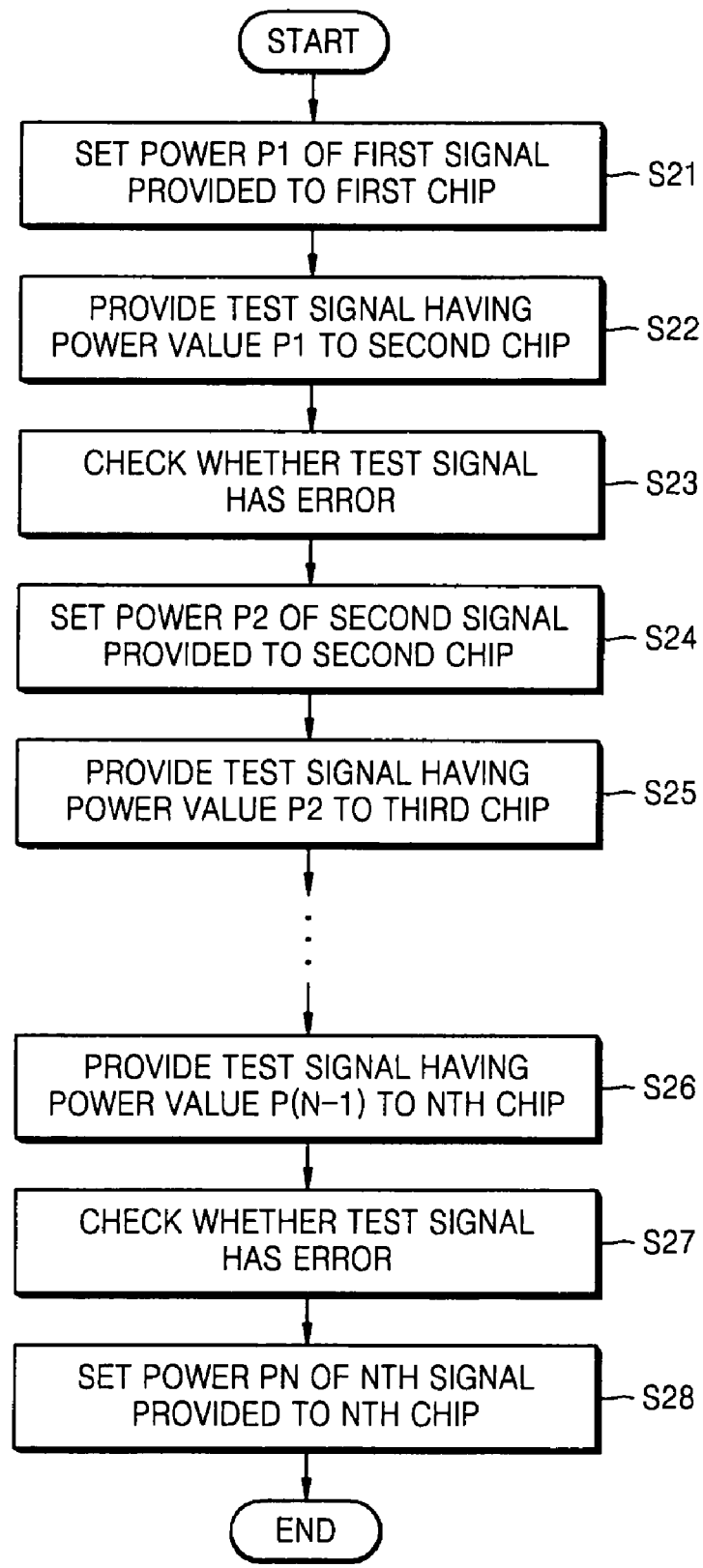
FIG. 8 is a flow chart illustrating a power initializing method of a semiconductor memory device according to a certain embodiment of the disclosed technology.

FIG. 8 is a flow chart illustrating an exemplary process of setting signal power for n semiconductor chips. When the power initialization process starts, power P1 of a first signal provided to a first chip is set in operation S21. The operation of setting the power of a signal provided to a chip can be identical to the operation illustrated in FIG. 7.

When the power P1 of the first signal provided to the first chip is set, the power of a signal provided to a second chip is set using the power P1. Specifically, a signal-providing chip controls an initial power value of a test signal such that the initial power value corresponds to P1 and provides the test signal to the second chip in operation S22. The second chip checks whether the test signal has an error in operation S23.

The second chip provides the checking result to the signal-providing chip, and the signal-providing chip decreases the power of the test signal according to the checking result and provides the test signal with the reduced power to the second chip. This process is repeated to set the smallest value among power values of the test signal, which are checked as "pass," as the power P2 of a second signal provided to the second chip in operation S24.

To set the power of a signal provided to a third chip, the signal-providing chip controls the initial power value of the test signal such that the initial power value corresponds to P2 and provides the test signal to the third chip in operation S25. The signal power setting process is sequentially performed for the first chip farthest from the signal-providing chip through the $n^{th}$ chip closest to the signal-providing chip. To set the power of an $n^{th}$ signal provided to the $n^{th}$ chip, the initial power value of the test signal provided to the $n^{th}$ chip is controlled such that the initial power value corresponds to a power value P (n−1) set when an $(n-1)^{th}$ chip is tested in operation S26. Then, the $n^{th}$ chip receives the test signal, checks whether the test signal has an error in operation S27, and provides the checking result to the signal-providing chip. The signal-providing chip sets the power Pn of the $n^{th}$ signal provided to the $n^{th}$ chip according to the checking result in operation S28.

The disclosed technology provides various desirable advantages, such as the optimization of signal transmission power (e.g., to prevent unnecessary power consumption) and the reduction of time required for a power initialization process, for example. Furthermore, because the power initialization process can be performed on-chip, signal power can be automatically controlled according to a variation in the surrounding environment.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A power initializing method of a semiconductor memory device having multiple chips in a stack structure, the power initializing method comprising:
   providing a test signal generated by a signal-providing chip to a first chip;
   checking whether the test signal provided to the first chip has an error;
   providing a checking result corresponding to the test signal provided to the first chip to the signal-providing chip;
   setting the power of a first signal provided to the first chip according to the checking result corresponding to the test signal provided to the first chip; and
   setting the power of a second signal provided to a second chip using the power of the first signal.

2. The power initializing method of claim 1, wherein the first chip is farthest from the signal-providing chip.

3. The power initializing method of claim 2, wherein an initial power value of the test signal provided to the first chip is set to a first power value that has a power large enough to be checked as "pass."

4. The power initializing method of claim 3, wherein setting the power of the first signal comprises controlling the test signal such that the test signal has a second power value smaller than the first power value when the checking result corresponds to "pass."

5. The power initializing method of claim 4, wherein setting the power of the first signal further comprises:
    checking whether the test signal having the second power value has an error; and
    providing the checking result to the signal-providing chip.

6. The power initializing method of claim 5, wherein setting the power of the first signal further comprises setting the power of the first signal to the first power value when the checking result for the second power value corresponds to "fail."

7. The power initializing method of claim 5, wherein setting the power of the first signal further comprises decreasing the power of the test signal in stages until the checking result becomes "fail" and providing the test signal to the first chip when the checking result corresponds to "pass."

8. The power initializing method of claim 7, wherein setting the power of the first signal comprises setting the power of the first signal to an $(n-1)^{th}$ power value corresponding to the smallest power value among power values checked as "pass" if the test signal is checked as "fail" when the test signal has an $n^{th}$ power value.

9. The power initializing method of claim 1, wherein setting the power of the second signal provided to the second chip comprises:
    providing a test signal to the second chip, wherein the test signal provided to the second chip has a power corresponding to the set power of the first signal;
    checking whether the test signal provided to the second chip has an error;
    providing a checking result corresponding to the test signal provided to the second chip to the signal-providing chip; and
    setting a smallest value among test signal power values checked as "pass" as the power of the second signal provided to the second chip according to the checking result corresponding to the test signal provided to the second chip.

10. The power initializing method of claim 9, wherein the semiconductor memory device comprises first through $n^{th}$ chips receiving signals from the signal-providing chip, and wherein signal power is sequentially set for the first chip farthest from the signal-providing chip through the $n^{th}$ chip closest to the signal-providing chip.

11. The power initializing method of claim 10, wherein the power of a previously set signal is used as an initial power value of the test signal provided to the first chip when the power of a next signal is set.

12. The power initializing method of claim 1, wherein the multiple chips wirelessly transmit and receive signals according to inductive coupling.

13. The power initializing method of claim 1, wherein the test signal is a pseudo random binary sequence (PRBS) signal.

14. A power initializing method of a semiconductor memory device, the power initializing method comprising:
    wirelessly providing a test signal having a first power value to a first chip, wherein the test signal provided to the first chip is generated by a signal-providing chip;
    checking whether the test signal provided to the first chip has an error;
    wirelessly providing a result of the checking to the signal-providing chip; and
    setting the power of a first signal provided to the first chip according to the checking result.

15. The power initializing method of claim 14, wherein the semiconductor memory device comprises first through $n^{th}$ chips receiving signals from the signal-providing chip, and wherein signal power is sequentially set for the first through $n^{th}$ chips, wherein the first chip is farthest from the signal-providing chip and the nth chip is closest to the signal-providing chip.

16. The power initializing method of claim 15, wherein the power of a previously set signal is used as an initial power value of the test signal when the power of a next signal is set.

17. The power initializing method of claim 1, wherein the second chip is adjacent to the first chip and close to the signal-providing chip.

18. The power initializing method of claim 4, further comprising providing the test signal having the second power value to the first chip.

19. The power initializing method of claim 8, wherein n is an integer equal to or greater than 3.

20. The power initializing method of claim 14, wherein the semiconductor memory device comprises multiple semiconductor chips transmitting and receiving signals according to inductive coupling.

21. A semiconductor memory device having multiple chips in a stack structure, comprising:
    a signal-providing chip operable to generate a test signal having a predetermined pattern and control a power of the test signal; and
    at least two signal-receiving chips operable to receive the test signal, check whether the test signal has an error, and output a checking result,
    wherein a power of a first signal provided to a first one of the at least two signal-receiving chips is set according to the checking result and a power of a second signal provided to a second one of the at least two signal-receiving chips adjacent to the first one of the at least two signal-receiving chips and close to the signal-providing chip is set using the set power of the first signal in a power initializing operation.

22. The semiconductor memory device of claim 21, wherein the signal-providing chip comprises:
    a first signal generator operable to generate the test signal; and
    a first power controller operable to control the power of the test signal generated by the first signal generator.

23. The semiconductor memory device of claim 22, wherein the at least one signal-receiving chip comprises:
    a second signal generator operable to generate a signal having the same pattern as the test signal generated by the first signal generator; and
    an error checker operable to compare the signal generated by the second signal generator to the test signal provided by the signal-providing chip to check whether the test signal has an error.

* * * * *